United States Patent [19]
Dischert et al.

[11] Patent Number: 6,023,718
[45] Date of Patent: *Feb. 8, 2000

[54] HIGH SPEED INTERPOLATION FILTER AND A METHOD THEREOF

[75] Inventors: Lee R. Dischert, Burlington; Jerome Shields, Atco, both of N.J.

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/853,859

[22] Filed: May 9, 1997

[51] Int. Cl.$^7$ .................................................. G06F 17/10
[52] U.S. Cl. .................................... 708/307; 708/306
[58] Field of Search ............................ 364/724, 724.05, 364/724.04; 375/44, 206, 200, 240, 395; 348/6, 7, 12, 13; 708/300, 301, 302–311

[56] References Cited

U.S. PATENT DOCUMENTS

| | | |
|---|---|---|
| 4,101,964 | 7/1978 | Betts . |
| 4,393,456 | 7/1983 | Marshall, Jr. ............................ 364/724 |
| 4,797,585 | 1/1989 | Segawa et al. ........................... 307/594 |
| 4,821,223 | 4/1989 | David ................................... 364/724.05 |
| 4,847,691 | 7/1989 | Barton et al. . |
| 4,881,191 | 11/1989 | Morton . |
| 4,893,316 | 1/1990 | Jane et al. ................................. 375/44 |
| 4,918,637 | 4/1990 | Morton . |
| 4,991,010 | 2/1991 | Hailey et al. . |
| 5,027,306 | 6/1991 | Dattoro et al. . |
| 5,057,911 | 10/1991 | Stec et al. . |
| 5,119,193 | 6/1992 | Noji . |
| 5,163,168 | 11/1992 | Hirano et al. ............................ 307/265 |
| 5,268,750 | 12/1993 | Stec et al. . |
| 5,396,110 | 3/1995 | Houston .................................. 327/172 |
| 5,422,827 | 6/1995 | Niehaus . |
| 5,485,215 | 1/1996 | Meyer et al. . |

OTHER PUBLICATIONS

Ronald E. Crochiere and Lawrence R. Rabiner, "Multirate Digital Signal Processing", Acoustics Research Department, Bell Laboratories, 1983, pp. 371–373.

*Primary Examiner*—Ayaz R. Sheikh
*Assistant Examiner*—Tim Vo
*Attorney, Agent, or Firm*—Ratner & Prestia

[57] ABSTRACT

A filter system that filters a digital signal to produce a filtered digital signal where the digital signal has alternating first data values and second data values. The filter system includes a demultiplexer that produces a first signal that includes the first data values and a second signal that includes the second data values. A first filter is provided to filter the first signal and the second signal to produce a first filtered signal including filtered first data values. A second filter is provided to filter the first signal and the second signal to produce a second filtered signal including filtered second data values. A multiplexer alternately selects the filtered first data values and the filtered second data values to produce the filtered digital signal.

14 Claims, 10 Drawing Sheets

HIGH SPEED INTERPOLATION FILTER AND A METHOD THEREOF

FIELD OF THE INVENTION

The present invention relates to a system method for filtering, and particularly to digital filters for filtering digital video signals.

BACKGROUND OF THE INVENTION

In the United States a standard has been proposed for digitally encoded high definition television signals. This standard is essentially the same as the MPEG-2 standard, proposed by the Moving Picture Experts Group (MPEG) of the International Standards Organization (ISO). The MPEG-2 standard is described in an International Standard (IS) publication entitled, "Information Technology—Generic Coding of Moving Pictures and Associated Audio, Recommendation H.626", ISO/IEC 13818-2, IS, 11/94 which is available from the ISO and which is hereby incorporated by reference for its teaching on the MPEG-2 digital video coding standard.

The MPEG-2 standard is actually several different standards. In MPEG-2 several different profiles are defined, each corresponding to a different level of complexity of the encoded image. For each profile, different levels are defined, each level corresponding to a different image resolution. One of the MPEG-2 "standards", known as Main Profile, Main Level is intended for encoding video signals conforming to existing television standards (i.e., NTSC and PAL). Another "standard", known as Main Profile, High Level, is intended for encoding high-definition television images. Images encoded according to the Main Profile, High Level standard may have as many as 1,152 active lines per image frame and 1,920 pixels per line.

The Main Profile, Main Level standard, on the other hand, defines a maximum picture size of 768 pixels per line and 567 lines per frame. At a frame rate of 30 frames per second, signals encoded according to this standard have a data rate of 13,063,680 pixels per second. By contrast, images encoded according to the Main Profile, High Level standard have a maximum data rate of 1,152 * 1,920 * 30 or 66,355,200 pixels per second. This data rate is more than five times the data rate of image data encoded according to the Main Profile Main Level standard. The standard proposed for HDTV encoding in the United States is a subset of this standard, having as many as 1,080 lines per frame, 1,920 pixels per line and a maximum frame rate, for this frame size, of 30 frames per second. The maximum data rate for this proposed standard is still far greater than the maximum data rate for the Main Profile, Main Level standard.

In many cases, the high definition television signals having a high data rate must be filtered. Using existing techniques, however, it is difficult to implement a filter at a high data rate because current filter chips are restricted in speed. Typically, for many filter operations, the data rate of incoming video is, for example, twice the speed of a conventional filter chip, and every incoming sample must be used to generate every outgoing pixel. The data rate of the pixels produced by the filter may be the same as or greater than the data rate of the incoming pixels.

In order to process the high data rate signals, conventional filter systems may use memory in order to slow the data rate or tiling the incoming pixels to allow the filter chips to operate at a lower speed. The increased memory used by the filter, however, requires a large amount of space on an integrated circuit. Alternatively, the data samples in the high data rate signal may be estimated to produce reduced resolution images that have a lower data rate.

Thus, it is desirable to provide a filter system that operates at an elevated data rate without using extra memory for data rate reduction. It is also desirable to provide a filter system that does not reduce the resolution of the images being filtered so that the filter system may operate at a lower data rate.

SUMMARY OF THE INVENTION

The present invention is directed to a filter system that filters a digital signal to produce a filtered digital signal. The digital signal has alternating first data values and second data values. The filter system includes a demultiplexer that produces a first signal that includes the first data values and a second signal that includes the second data values. A first filter is provided to filter the first signal and the second signal to produce a first filtered signal including filtered first data values. A second filter is provided to filter the first signal and the second signal to produce a second filtered signal including filtered second data values. A multiplexer alternately selects the filtered first data values and the filtered second data values to produce the filtered digital signal.

DETAILED DESCRIPTION OF THE INVENTION

Figure 1:
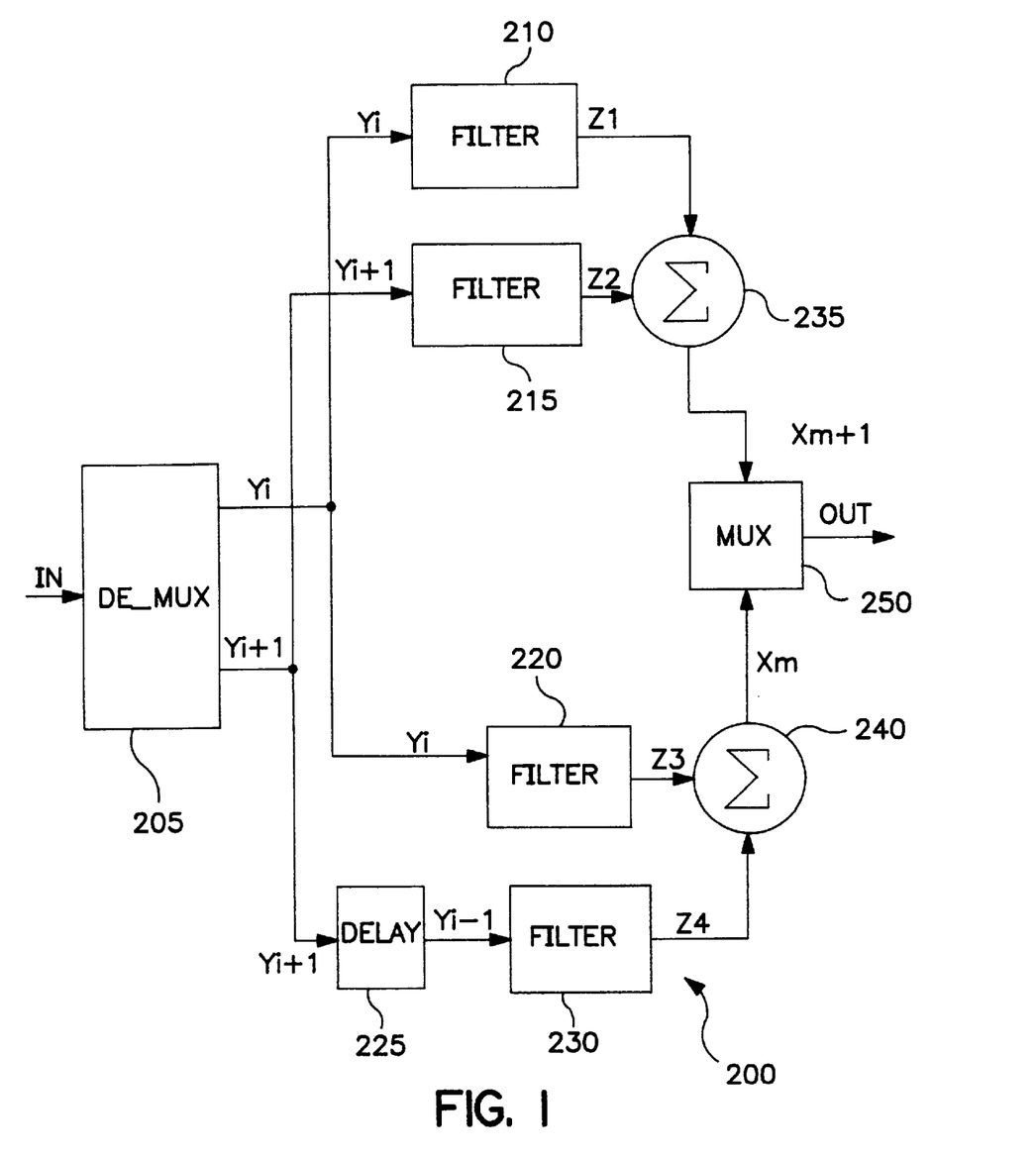
FIG. 1 is a block diagram of a filter system according to an exemplary embodiment of the present invention.
Figure 2:
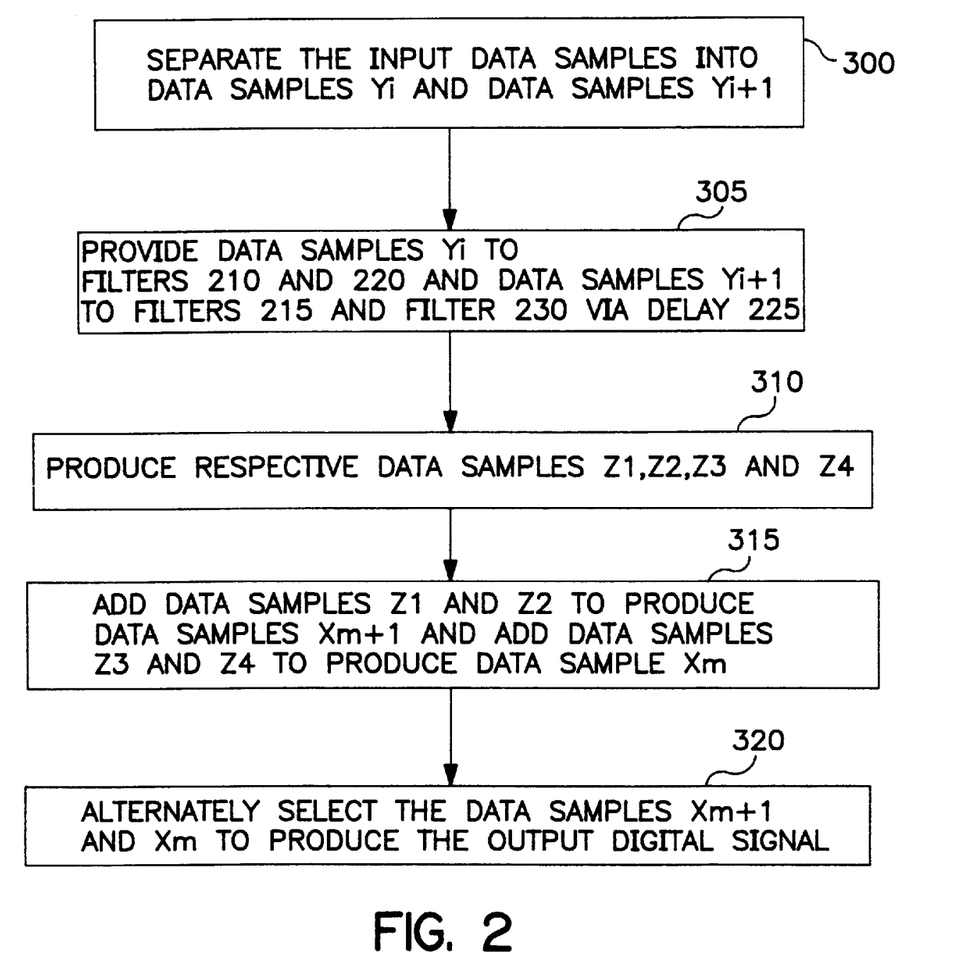
FIG. 2 is a flowchart diagram useful for explaining the operation of the filter system shown in FIG. 1.

Referring now to the drawings, wherein like reference numerals refer to like elements throughout, FIG. 1 shows a filter system 200 according to an exemplary embodiment of the present invention. The operation of the filter system shown in FIG. 1 is described below with reference to FIGS. 2, 3, and 4.

An input digital signal IN including data samples Y1, Y2, ... Yi, Yi+1 where i=0, 1, 2, 3, 4, ... n, and n is an integer, is provided to demultiplexer 205. At step 300, shown in FIG. 2, demultiplexer 205 separates the input data samples Y1, Y2, ... Yi, Yi+1, shown in FIG. 3, into data samples Yi and data samples Yi+1. In other words, the demultiplexer 205 separates the input data samples into even and odd data samples.

At step 305, the data samples Yi are provided to filter 210 and filter 220 and data samples Yi+1 are provided to filter 215 and delay element 225. The delay element 225 may include, for example, a register (not shown). The delay element 225 subsequently provides the data samples Yi+1 to filter 230 after delaying the data sample Yi+1 by two (2) high speed sample times. In other words, if data sample Yi+1 is being provided to the filter 215, then data sample Yi−1 is being provided to the filter 230. A high speed sample time is the rate at which one data sample is provided to the demultiplexer 205. Alternatively, the delay implemented by delay element 225 may be implemented by altering the coefficients of the filter 230 to incorporate the delay. In this case, the delay element 225 may be removed from the filter system 200.

Figure 3:
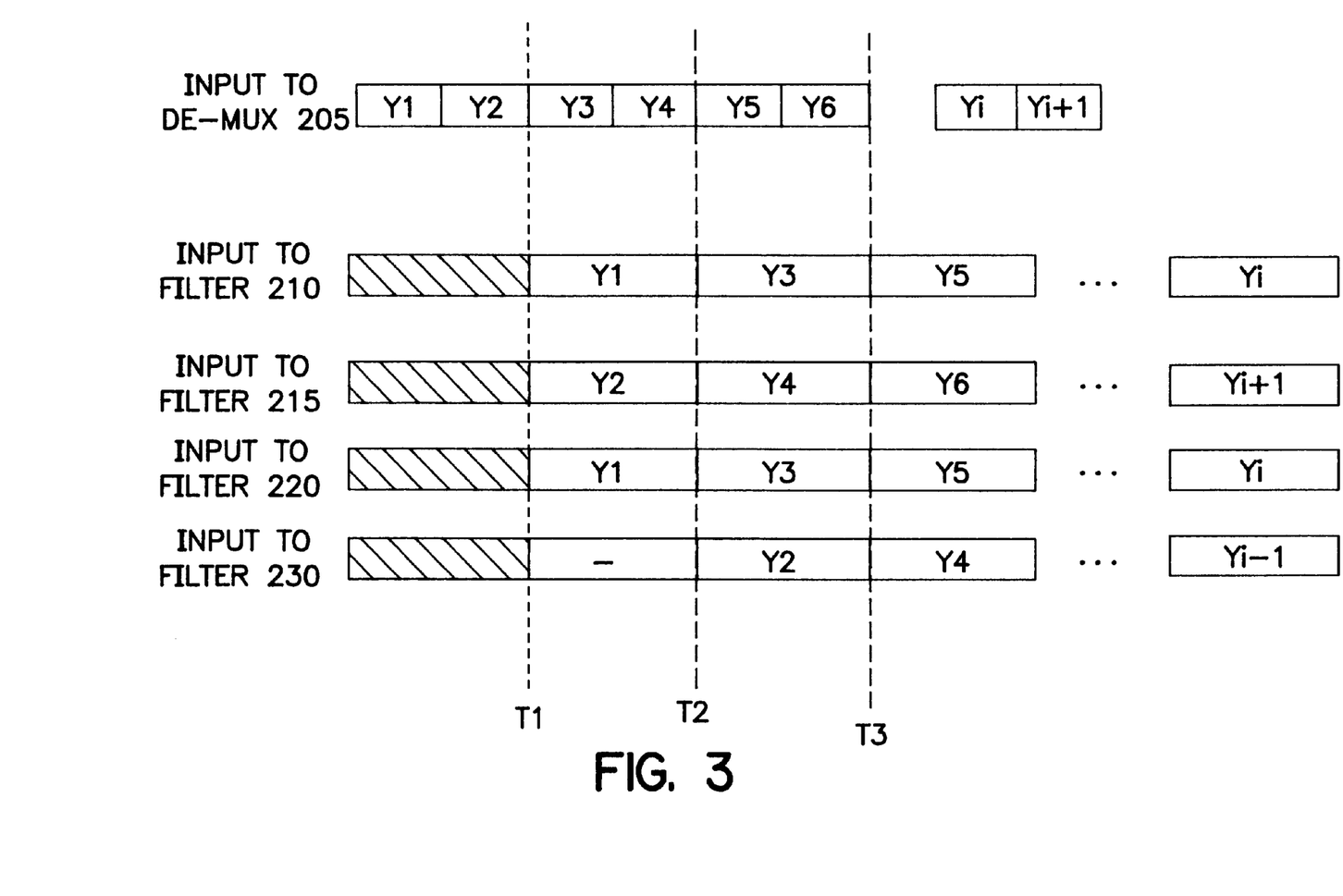
FIG. 3 is a timing diagram useful for explaining the operation of the filter system shown in FIG. 1.

As is shown in FIG. 3, at time T1 data samples Y1 and Y2, and Y1 are provided respectively to filters 210, 215, and 220. Subsequently, at time T2, data samples Y3, Y4, Y3, Y2 are respectfully provided to filters 210, 215, 220, and 230. This process is continually repeated as is shown in FIG. 3. The filters 210, 215, 220, and 230 operate at a data sample rate which is, for example, one-half the data rate that the data samples provided to the demultiplexer 205. Alternatively, the filters 210, 215, 220, and 230 may be operated at a lower or higher data rate. For example, the filters 210, 215, 220 and 230 may be operated at a lower data sample rate if the incoming digital signal is to be decimated to produce, for example, a lower resolution picture having fewer pixels. This may occur during the process, for example, of converting an incoming digital signal from a Main Profile, High Level format to a Main Profile, Main Level format.

Figure 5:
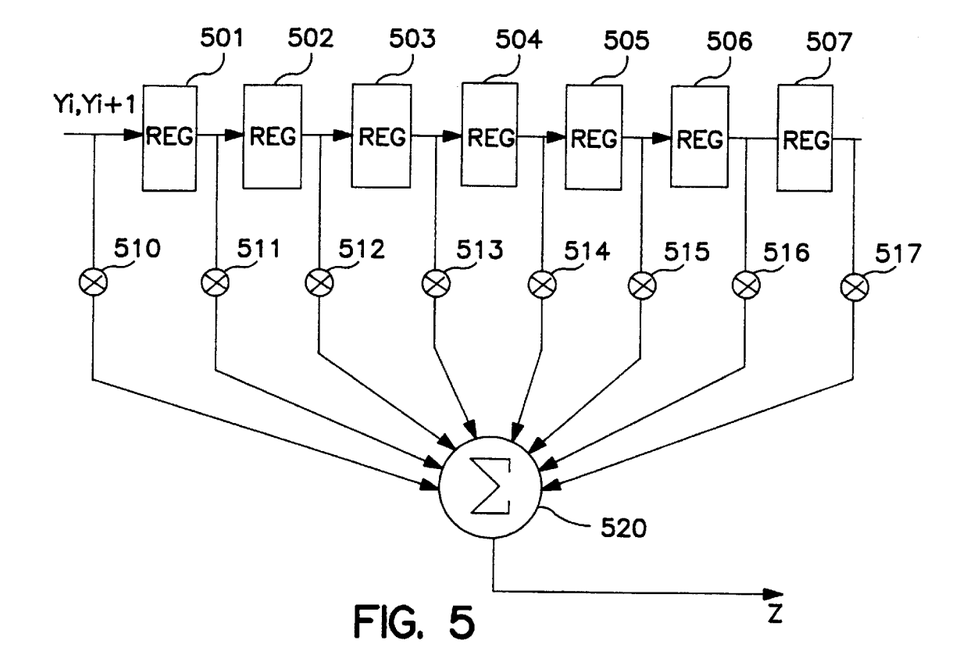
FIG. 5 is a block diagram of an exemplary filter for the filters shown in FIG. 1.

At step 310, the filters 210, 215, 220, and 230 produce respective data samples Z1, Z2, Z3, and Z4. An exemplary filter for filters 210, 215, 220, and 230 is shown in FIG. 5. FIG. 5 shows an 8-tap finite impulse response (FIR) filter. The 8-tap filter includes seven registers 501 through 507, multipliers 510 through 517, and summing network 520. The registers 501 to 507 are coupled in series. An input port of multipliers 510 through 517 is coupled on either side of the registers 501–507. The output ports of multipliers 510 through 517 are coupled to the summing network 520.

The filters 210 and 215 are the same phase and have different coefficients of the filter system. The filters 220 and 230 have different phases and different coefficients of the filter system. The difference in phase between filters 220 and 230 is one high speed sample in time.

Figure 4:
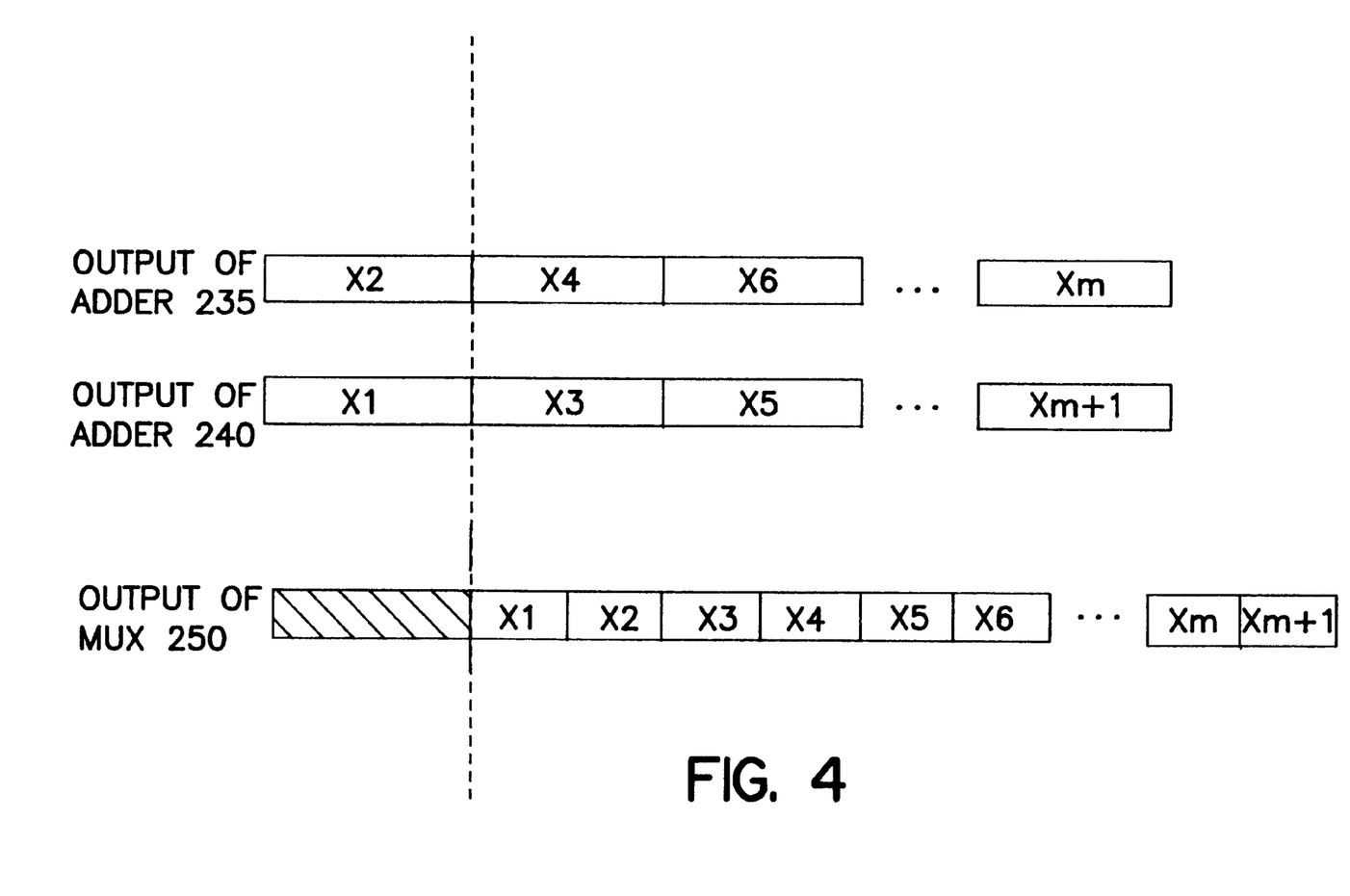
FIG. 4 is a timing diagram useful for explaining the operation of the filter system shown in FIG. 1.

At step 315, the data samples Z1 produced by the filter 210 and the data samples Z2 produced by filter 215 are added by adder 235 to produce data sample Xm+1 where m=0, 2, 4, . . . p, and p is an integer. Similarly, the data samples Z3 and Z4 produce respectively by filter 220 and 230 are provided to adder 240 to produce data samples Xm which is provided to the multiplexer 250. The data samples Xm and Xm+1 produced by the adders 235 and 240 are shown in FIG. 4. At step 320, multiplexer 250 alternately selects the data samples Xm+1 and Xm from adders 235 and 240 to produce the filtered digital signal OUT shown in FIG. 4.

By using this exemplary filter system, multiple filters may be combined and operated at lower speeds to sample and produce digital signals at a higher data rate. The filter system can sample the data at up to twice the fastest clock rate of the filters used to implement the filter system. This is accomplished without the use of additional memory to reduce the data rate of the incoming digital signal.

The filter system described above may be used as an interpolating filter to produce phases between input data samples. The filter system described above may also be used as an interpolation filter in a system for continually and automatically correcting registration errors in a color television camera. One such system is described in U.S. patent application Ser. No. 08/783,214 entitled REGISTRATION CORRECTION WAVEFORM DETERMINATION METHOD AND SYSTEM FOR A TELEVISION CAMERA.

Figure 6:
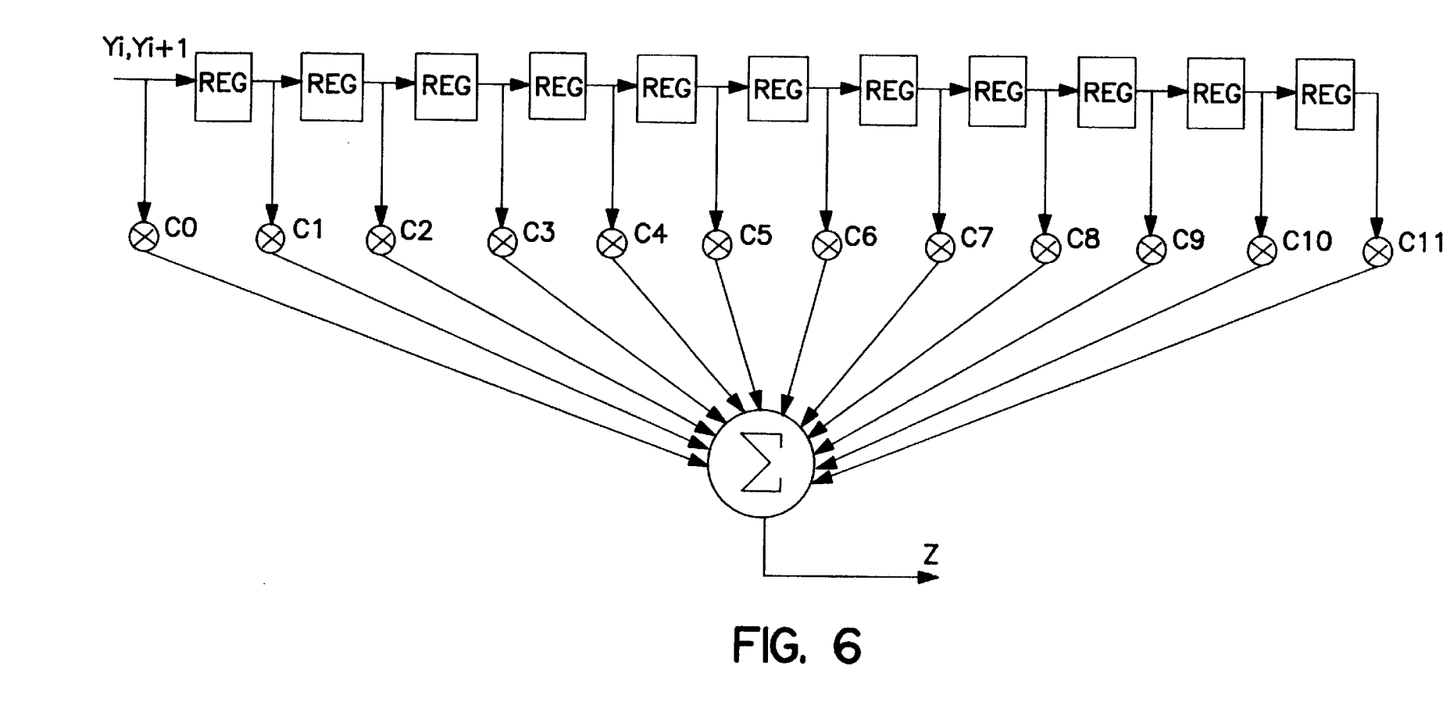
FIG. 6 is a block diagram of an exemplary filter for the filters shown in FIG. 1.

In this case, the 8-tap filter shown in FIG. 5 would be replaced with, for example, the 12-tap filter shown in FIG. 6 for each of the filters 210, 215, 220, and 230. Coefficient values C0 through C11 suitable for use in the filters 210, 215, 220, and 230 for an interpolation operation, are provided below in Tables 1, 2, and 3. Table 1 includes the coefficients for the filters 210 and 230. Table 2 includes coefficients for the filter 215 and Table 3 includes coefficients for the filter 220. For each multiplier C0 through C11, there are eight corresponding coefficients values designated by phases (P0) through (P7). The coefficient values repeat every four phases.

The coefficients values C0 through C11 are rotated every clock cycle for sample rate conversion. Thus, for example, the coefficients designated by phase one (P1) would be used for the coefficient values C0 through C11 at a first clock cycle. At the next clock cycle, the filter rotates coefficient values C0 through C11 to phase two (P2). At the next subsequent clock cycle, the filter rotates to the phase three (P3) coefficient values. After each of the eight phases have been used, the process is started again using the phase zero coefficient values. Alternatively, the coefficients values C0 through C11 may be rotated at a different rate and/or at a varying rate. For example, the coefficients are rotated at a varying rate when the geometry of the picture is changed.

TABLE 1

| PHASE | C0 | C1 | C2 | C3 | C4 | C5 | C6 | C7 | C8 | C9 | C10 | C11 |
|---|---|---|---|---|---|---|---|---|---|---|---|---|
| P0 | 0 | 0 | 0 | 0 | 0 | 0 | 2047 | 0 | 0 | 0 | 0 | 0 |
| P1 | 0 | −46 | −58 | −78 | −120 | −258 | 1804 | 201 | 106 | 72 | 55 | 44 |
| P2 | 0 | −67 | −84 | −115 | −181 | −422 | 1268 | 253 | 141 | 97 | 74 | 60 |
| P3 | 0 | −49 | −62 | −86 | −139 | −361 | 600 | 164 | 95 | 67 | 52 | 42 |
| P4 | 0 | 0 | 0 | 0 | 0 | 0 | 0 | 0 | 0 | 0 | 0 | 0 |
| P5 | 42 | 52 | 67 | 95 | 164 | 602 | −361 | −139 | −86 | −62 | −49 | 0 |
| P6 | 60 | 74 | 97 | 141 | 253 | 1267 | −422 | −181 | −115 | −84 | −67 | 0 |
| P7 | 44 | 55 | 72 | 106 | 201 | 1806 | −258 | −120 | −78 | −58 | −46 | 0 |

TABLE 2

| PHASE | C0 | C1 | C2 | C3 | C4 | C5 | C6 | C7 | C8 | C9 | C10 | C11 |
|---|---|---|---|---|---|---|---|---|---|---|---|---|
| P0 | 0 | 0 | 0 | 0 | 0 | 0 | 0 | 0 | 0 | 0 | 0 | 0 |
| P1 | 0 | 42 | 52 | 67 | 95 | 164 | 602 | −361 | −139 | −86 | −62 | −49 |
| P2 | 0 | 60 | 74 | 97 | 141 | 253 | 1267 | −422 | −181 | −115 | −84 | −67 |
| P3 | 0 | 44 | 55 | 72 | 106 | 201 | 1806 | −258 | −120 | −78 | −58 | −46 |
| P4 | 0 | 0 | 0 | 0 | 0 | 0 | 2047 | 0 | 0 | 0 | 0 | 0 |
| P5 | 0 | −46 | −58 | −78 | −120 | −258 | 1804 | 201 | 106 | 72 | 55 | 44 |
| P6 | 0 | −67 | −84 | −115 | −181 | −422 | 1268 | 253 | 141 | 97 | 74 | 60 |
| P7 | 0 | −49 | −62 | −86 | −139 | −361 | 600 | 164 | 95 | 67 | 52 | 42 |

TABLE 3

| PHASE | C0 | C1 | C2 | C3 | C4 | C5 | C6 | C7 | C8 | C9 | C10 | C11 |
|---|---|---|---|---|---|---|---|---|---|---|---|---|
| P0 | 0 | 0 | 0 | 0 | 0 | 0 | 0 | 0 | 0 | 0 | 0 | 0 |
| P1 | 42 | 52 | 67 | 95 | 164 | 602 | −361 | −139 | −86 | −62 | −49 | 0 |
| P2 | 60 | 74 | 97 | 141 | 253 | 1267 | −422 | −181 | −115 | −84 | −67 | 0 |
| P3 | 44 | 55 | 72 | 106 | 201 | 1806 | −258 | −120 | −78 | −58 | −46 | 0 |
| P4 | 0 | 0 | 0 | 0 | 0 | 2047 | 0 | 0 | 0 | 0 | 0 | 0 |
| P5 | −46 | −58 | −78 | −120 | −258 | 1804 | 201 | 106 | 72 | 55 | 44 | 0 |
| P6 | −67 | −84 | −115 | −181 | −422 | 1268 | 253 | 141 | 97 | 74 | 60 | 0 |
| P7 | −49 | −62 | −86 | −139 | −361 | 600 | 164 | 95 | 67 | 52 | 42 | 0 |

Figure 9:
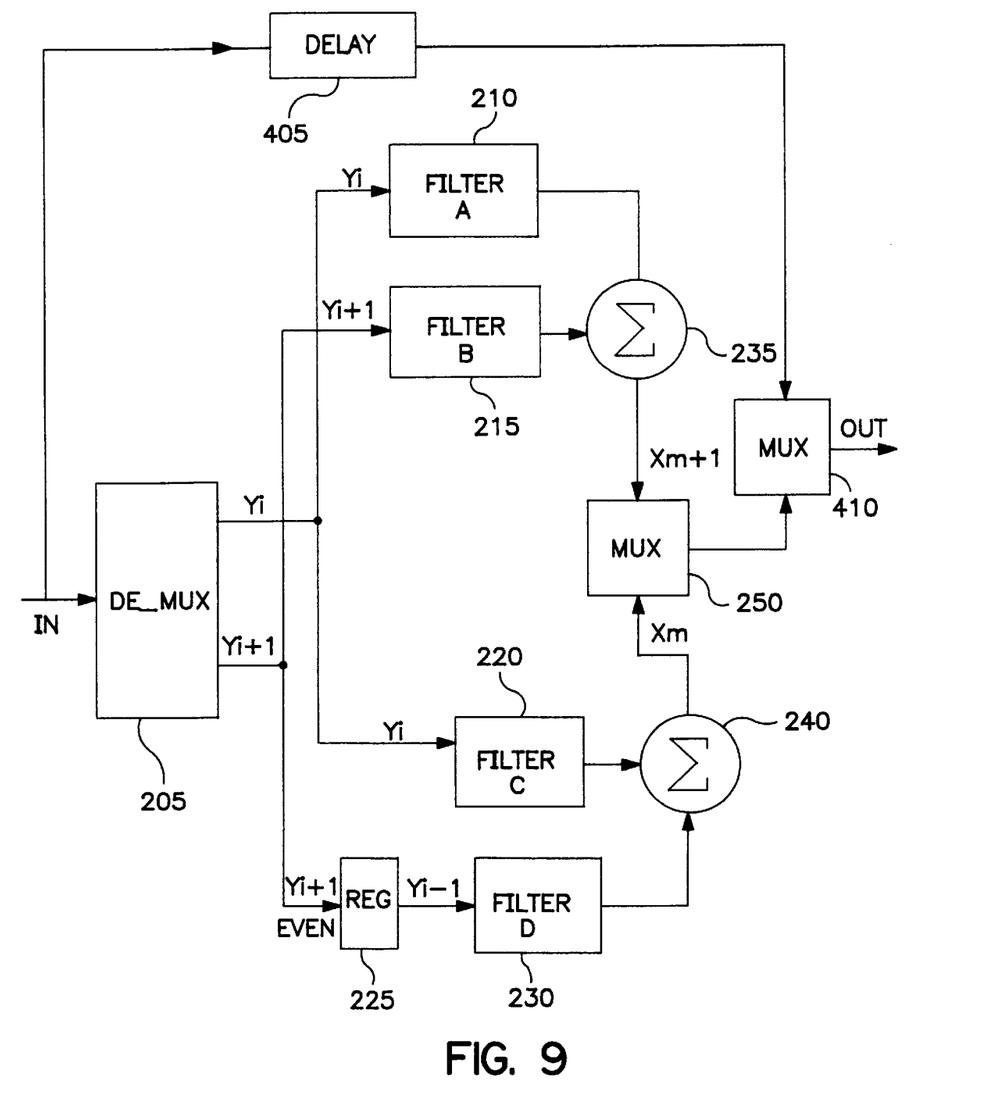
FIG. 9 is a block diagram of an oversampling filter according to an exemplary embodiment of the present invention.

FIG. 9 is a block diagram of an oversampling filter according to another exemplary embodiment of the present invention. In FIG. 9, components having like reference numerals to the components shown in FIG. 1 operate the same. In addition to the components shown in FIG. 1, the oversampling filter includes a delay 405 and a multiplexer 410. In this embodiment there are, for example, one set of coefficents for producing data samples X1, X2, ... Xm, Ym+1 between the original input data samples Y1, Y2, ..., Yi, Yi+1.

Delay 405 delays the input data samples Y1, Y2, ..., Yi, Yi+1 for a period of time corresponding to the time to produce data samples X1, X2, ... Xm, Xm+1. The multiplexer 410 alternatively selects the delayed input data samples Y1, ..., Yi, Yi+1 and the data samples X1, X2, ... Xm, Xm+1 provided from the multiplexer 250.

Figure 10:
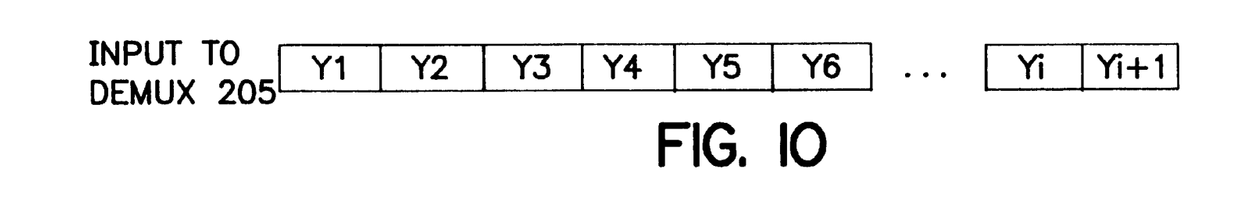
FIG. 10 is a timing diagram useful for explaining the operation of the oversampling filter shown in FIG. 9.
Figure 11:
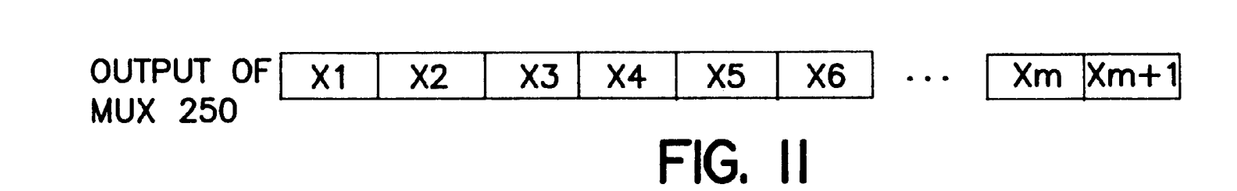
FIG. 11 is a timing diagram useful explaining the operation of the oversampling filter shown in FIG. 9.
Figure 12:
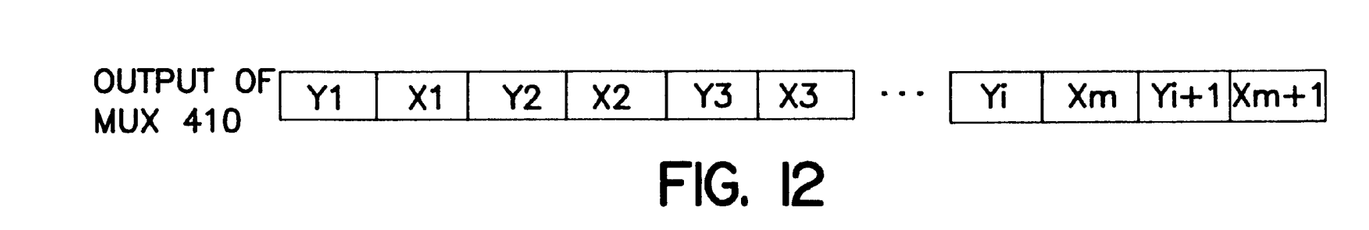
FIG. 12 is a timing diagram useful for explaining the operation of the oversampling filter shown in FIG. 9.

FIGS. 10, 11, and 12 illustrate the operation of the over sampling filter shown in FIG. 9. FIG. 10 is a diagram illustrating the data samples Y1, ..., Yi, Yi+1 provided to multiplexer 205. FIG. 11 is a diagram illustrating the data samples X1, X2, ... Xm, Xm+1 provided from multiplexer 250. The multiplexer 410 alternately selects the input data samples Y1, ..., Yi, Yi+1, shown in FIG. 10, and the data samples X1, X2, ... Xm, Xm+1, shown in FIG. 11, provided from multiplexer 250 to produce the output digital signal shown in FIG. 12. As is demonstrated by FIGS. 10 through 12, the oversampling filter produces data samples X1, X2, ..., Xm, Xm+1 between input data samples Y1, Y2, ..., Yi, Yi+1. The data samples X1, X2, ..., Xm, Xm+1 and Y1, X2, ..., Yi, Yi+1 are multiplexed together to create a two times oversampled digital signal using a filter system having filters that operate at ¼ the output rate of the oversampling filter.

Figure 7:
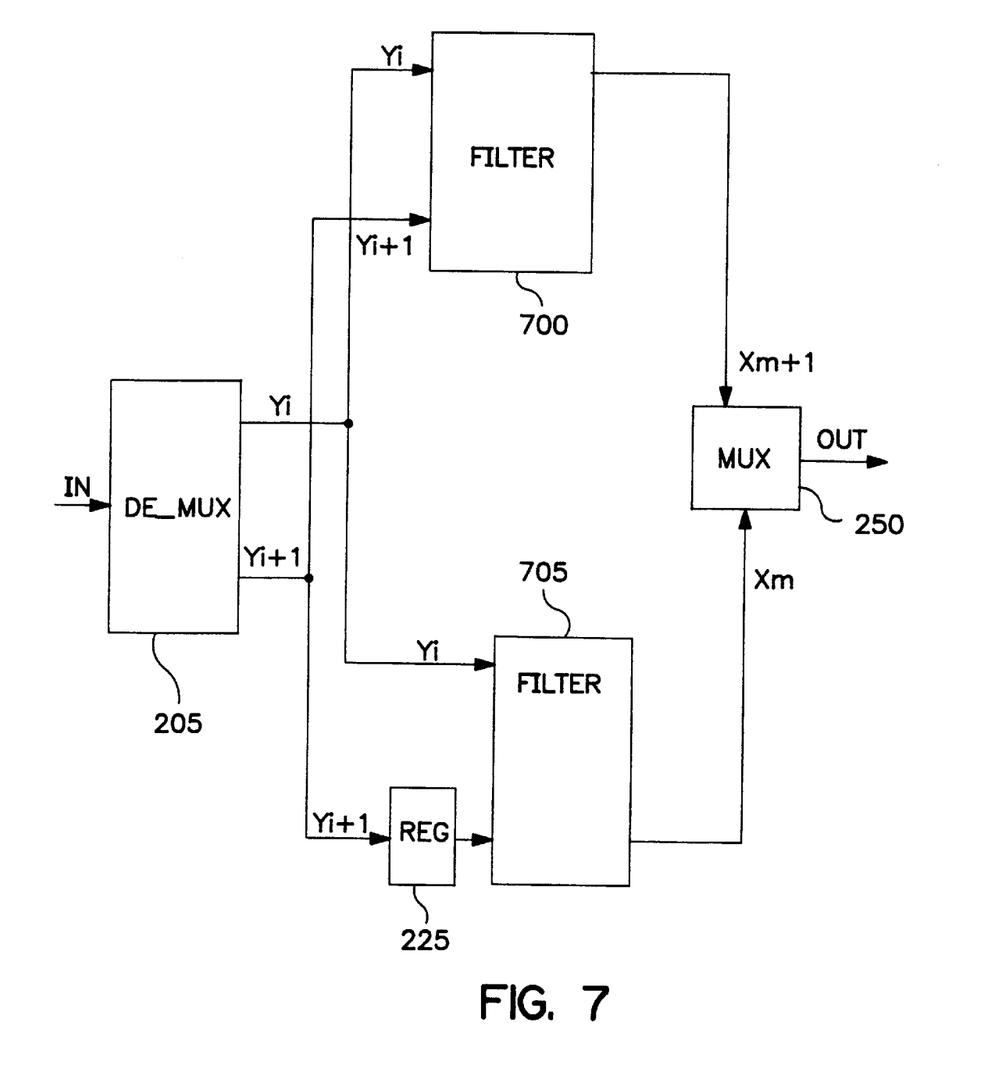
FIG. 7 is a block diagram of a filter system according to another exemplary embodiment of the present invention.

FIG. 7 is a block diagram of an alternative embodiment for the filter system. The filter system shown in FIG. 7 operates in the same way as the filter shown in FIG. 1 except that filters 210 and 215 and adder 235 have been replaced by filter 700 and filter 220 and 230 and adder 240 have been replaced by filter 705.

Figure 8:
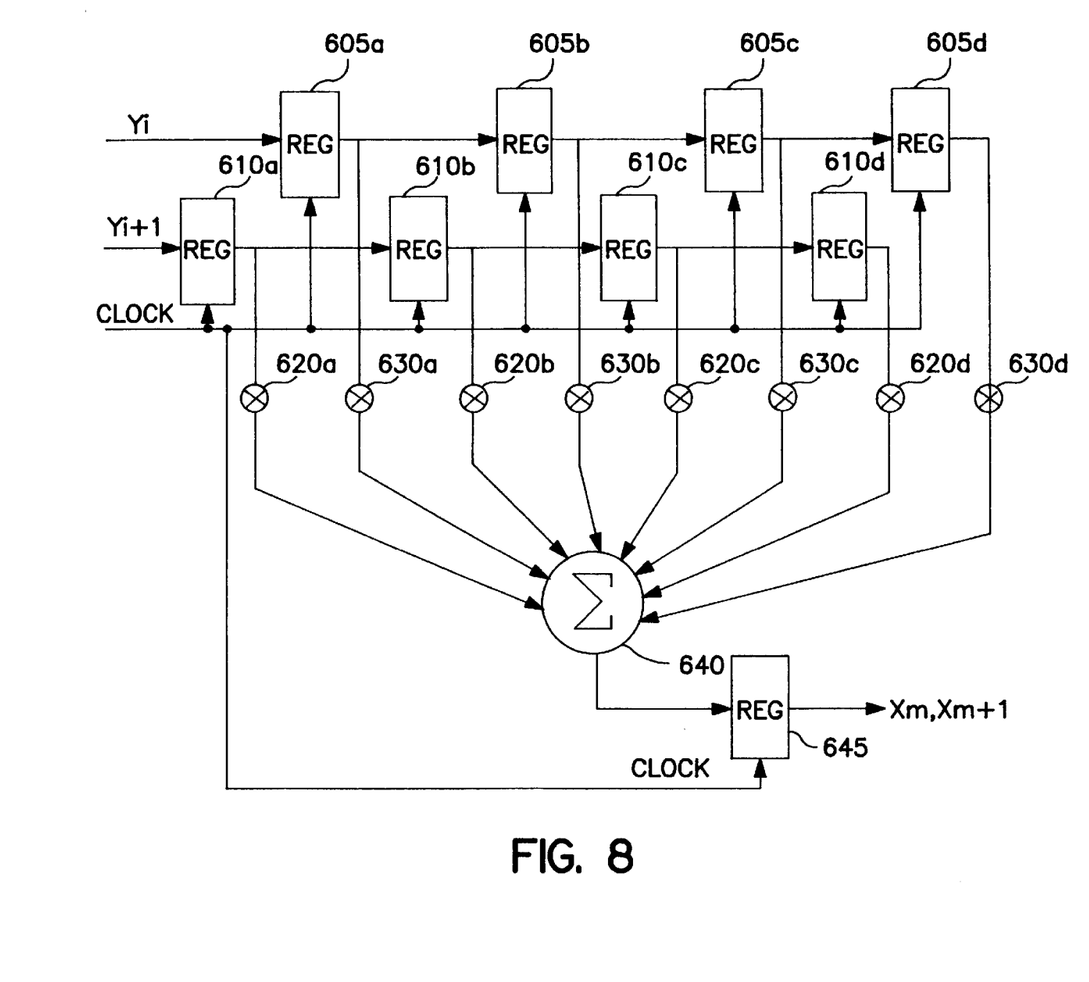
FIG. 8 is a block diagram of a combined filter for the first and second filter or the third and fourth filter shown in FIG. 7 according to another exemplary embodiment of the present invention.

FIG. 8 is a block diagram of the circuitry for implementing filters 700 and 705. An exemplary filter for implementing the filter shown in FIG. 8 is described in U.S. Pat. No. 5,057,911 dated Oct. 15, 1991 and issued to Stec et al. The filter is an 8-tap filter having separate delays or registers 605a through 605d and 610a through 610d for every other tap of the filter.

There are a total of four input delays or registers 605a through 605d for the data samples Yi and a total of four input delays or filters 610a through 610d for the data samples Yi+1. An input port of a multiplier 620a is coupled after each register 610a–610d. An input port of each of the multipliers 630a–630d is coupled after a respective register 605a–605d. The output ports of multipliers 620a–620d and 630a–630d are coupled to summing network 640. The summing network 640 produces data samples Xm or Xm+1 that are provided to register 645. the register 645 is coupled to multiplexer 250.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. For example, although the invention has been described with two sets of parallel filters, three or more sets of parallel filters may be provided. In this case, each set of parallel filters provides one of every three output data samples.

Further, although the invention has been described in terms of an interpolation filtering system, it is contemplated that it may be used for other types of filtering. In addition, although the invention has been described in terms of exemplary embodiments which use one-dimensional filters, it is contemplated that the same technique of processing alternate data samples in parallel may be used to effectively separate two-dimensional or N-dimensional signal processing methods into processing operations which may then be performed at lower data rates.

What is claimed:

1. A filter system for filtering a digital input signal to produce an oversampled digital signal, the digital input signal having alternating first data values and second data values, the filter system comprising:

demultiplexer means for producing a first signal including the first data values and a second signal including the second data values;

first filter means for filtering the first signal and the second signal to produce a first filtered signal including filtered first data values;

second filter means for filtering the first signal and the second signal to produce a second filtered signal including filtered second data values; and multiplexer means coupled to receive the digital input signal at a first input port, the filtered first data values at a second input port and the filtered second data values at a third input port for alternately selecting the filtered first data values, the values of the digital input signal and the filtered second data values to produce the oversampled digital signal.

2. The filter system according to claim 1 wherein:

the first filter means includes:
a first filter that filters the first data values, and
a second filter that filters the second data values; and the second filter means includes:
a third filter that filters the first data values, and
a fourth filter that filters the second data values.

3. The filter system according to claim 1 wherein the data rate of the digital input signal is twice the data rate of the first signal and the second signal.

4. The filter system according to claim 1 wherein the first filter means and the second filter means operate in parallel.

5. The filter system according to claim 1 wherein the first filter means includes:
means for separately producing a first intermediate signal using the first data values;
means for separately producing a second intermediate signal using the second data values; and
means for combining the first intermediate signal and the second intermediate signal to produce the first filtered signal.

6. The filter system according to claim 2 further comprising:
means for adding data values produced by the first filter to data values produced by the second filter to produce the first filtered signal; and
means for adding data values produced by the third filter to data values produced by the fourth filter to produce the second filtered signal.

7. The filter system according to claim 2 further comprising delay means for delaying the second data values provided to the fourth filter.

8. A filter system for filtering a digital input signal to produce an oversampled digital signal, the digital input signal having alternating first data values and second data values, the filter system comprising:
a first filter;
a second filter;
a demultiplexer having an even output data port and an odd output data port, each coupled to the first filter and the second filter; and
a multiplexer having first, second and third input terminals, the first input terminal being coupled to the digital input signal, the second input terminal being coupled to the first filter and the third input terminal being coupled to the second filter for alternately selecting the first filtered data values, the values of the digital input signal and the filtered second data values to produce the oversampled digital signal.

9. The filter system according to claim 8 wherein the first filter includes:
a first parallel filter that receives the first data samples, and
a second parallel filter that receives the second data samples.

10. A method for filtering an input digital signal to produce an oversampled digital signal, the digital input signal having alternating first data values and second data values, the method comprising the steps of:

(a) separating the digital signal into a first signal including the first data values and a second signal including the second data values;

(b) filtering the first signal and the second signal to produce a first filtered signal including filtered first data values;

(c) filtering the first signal and the second signal to produce a second filtered signal including filtered second data values; and (d) alternately selecting from among three sources of data values: (1) the filtered first data values, (2) the values of the input digital signal and (3) the filtered second data values to produce the oversampled digital signal.

11. The method according to claim 10 wherein:

step (b) further includes the steps of:
(b1) separately filtering the first data values, and
(b2) separately filtering the second data values; and step (c) further includes the steps of:
(c1) separately filtering the first data values, and
(c2) separately filtering the second data values.

12. The method according to claim 10 wherein step (b) comprises the steps of:
(b1) separately producing a first intermediate signal using the first data values;
(b2) separately producing a second intermediate signal using the second data values; and
(b3) combining the first intermediate signal and the second intermediate signal to produce the first filtered signal.

13. The method according to claim 11 further comprising the steps of:
adding data values produced at step (b1) to data values produced at step (b2) to produce the first filtered signal; and
adding data values produced at step (c1) to data values produced at step (c2) to produce the second filtered signal.

14. A filter system for filtering a digital input signal having a first sample rate to produce an oversampled digital signal having a second sample rate which is twice the first sample rate, the digital input signal having alternating first data values and second data values, the filter system comprising:

demultiplexer means for producing a first signal including the first data values and a second signal including the second data values, each of the first and second signals having a third sample rate which is one half of the first sample rate;

first filter means, operating at the third sample rate, for filtering the first signal and the second signal to produce a first filtered signal including filtered first data values;

second filter means, operating at the third sample rate, for filtering the first signal and the second signal to produce a second filtered signal including filtered second data values; and multiplexer means coupled to receive the digital input signal at a first input port, the filtered first data values at a second input port and the filtered second data values at a third input port for alternately selecting the filtered first data values, the values of the digital input signal and the filtered second data values to produce the oversampled digital signal at the second sample rate.

* * * * *

UNITED STATES PATENT AND TRADEMARK OFFICE
CERTIFICATE OF CORRECTION

PATENT NO. : 6,023,718
DATED : February 8, 2000
INVENTOR(S) : Dischert et al.

It is certified that error appears in the above-indentified patent and that said Letters Patent is hereby corrected as shown below:

On the cover page, item [56] References Cited list the following:

U.S. PATENT DOCUMENTS 4,852,035   7/1989   Michener

FOREIGN PATENT DOCUMENTS

0580924A   2/1994   EPO
0445335A   9/1991   EPO
3412106A   10/1985   DE

OTHER DOCUMENTS

Signed and Sealed this

Third Day of April, 2001

*Attest:*

NICHOLAS P. GODICI

*Attesting Officer*   Acting Director of the United States Patent and Trademark Office